(12) United States Patent
Jung et al.

(10) Patent No.: US 8,293,121 B2
(45) Date of Patent: Oct. 23, 2012

(54) METHOD FOR FORMING FINE WIRING

(75) Inventors: Hyun-Chyl Jung, Yongin-si (KR);
Jae-Woo Joung, Suwon-si (KR);
Myung-Joon Jang, Seoul (KR);
Yoon-Ah Baik, Suwon-si (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 931 days.

(21) Appl. No.: 11/892,844

(22) Filed: Aug. 28, 2007

(65) Prior Publication Data
US 2008/0083698 A1 Apr. 10, 2008

(30) Foreign Application Priority Data

Sep. 27, 2006 (KR) .................. 10-2006-0094403
Oct. 11, 2006 (KR) .................. 10-2006-0098800

(51) Int. Cl.
*H01B 13/00* (2006.01)
(52) U.S. Cl. ............. 216/13; 427/402; 427/404
(58) Field of Classification Search .......... 216/13; 427/402, 404
See application file for complete search history.

(56) References Cited

U.S. PATENT DOCUMENTS

| | | | | |
|---|---|---|---|---|
| 3,992,212 A | * | 11/1976 | Youtsey et al. | 106/1.14 |
| 6,855,378 B1 | * | 2/2005 | Narang | 427/553 |
| 7,255,782 B2 | * | 8/2007 | Crouse | 205/163 |
| 2004/0126708 A1 | * | 7/2004 | Jing et al. | 430/320 |
| 2005/0252398 A1 | * | 11/2005 | Ohkura et al. | 101/368 |
| 2006/0066704 A1 | * | 3/2006 | Nishida | 347/103 |
| 2006/0068173 A1 | * | 3/2006 | Kajiyama et al. | 428/195.1 |
| 2006/0192183 A1 | * | 8/2006 | Klyszcz et al. | 252/500 |
| 2006/0208230 A1 | * | 9/2006 | Cho et al. | 252/500 |

FOREIGN PATENT DOCUMENTS

| | | |
|---|---|---|
| JP | 2005-129922 | 5/2005 |
| JP | 2006-080286 | 3/2006 |
| JP | 2006-222408 | 8/2006 |

OTHER PUBLICATIONS

Japanese Office Action, w/ partial English translation thereof, issued in Japanese Patent Application No. JP 2007-252607 dated Feb. 2, 2010.

* cited by examiner

*Primary Examiner* — Shamim Ahmed
(74) *Attorney, Agent, or Firm* — McDermott Will & Emery LLP

(57) ABSTRACT

The present invention relates to a method for forming fine wiring comprising: preparing a substrate for a printed circuit board; forming a metal thin sacrificial layer on the substrate using a first metal ink; forming a wiring on the metal thin sacrificial layer by inkjet printing using a second metal ink; and removing a portion of the metal thin sacrificial layer to form a wiring pattern. The method for forming fine wiring according to the invention can improve adhesiveness by using metal thin sacrificial layer and prevent spreading of ink in forming fine wiring.

6 Claims, 12 Drawing Sheets
(8 of 12 Drawing Sheet(s) Filed in Color)

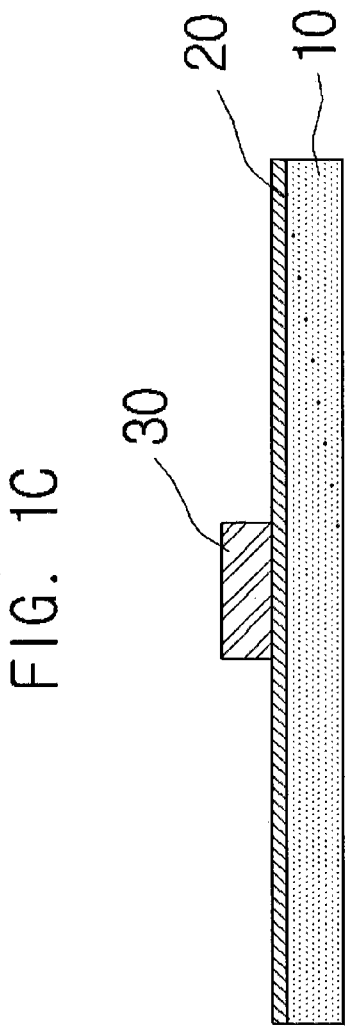

METHOD FOR FORMING FINE WIRING

CROSS-REFERENCE TO RELATED APPLICATIONS

This application claims the benefit of Korean Patent Applications No. 10-2006-0094403 filed with the Korean Intellectual Property Office on Sep. 27, 2006 and No. 10-2006-0098800 filed with the Korean Intellectual Property Office on Oct. 11, 2006, the disclosure of which is incorporated herein by reference in its entirety.

BACKGROUND

1. Technical Field

The present invention relates to a method for forming fine wiring, in particular, a method for forming fine wiring which can prevent spreading of droplets on the substrate, increase the width without bulging during high resolution printing or repeated printings, and increase adhesiveness between the substrate and wiring.

2. Description of the Related Art

Ink-jet technique allows precise ejection of substances to desired positions with desired quantity. Since the ink-jet technique does not require the photolithography process, which uses a mask in patterning, by computer engaged direct printing, and have an advantage that printing on a portion having prominence and depression is possible, many efforts are endeavored to apply this technique in industrial fields.

However, in forming fine wiring, the ink-jet technique has limitation that if droplets ejected from a head nozzle to a surface that has not been specially treated diffuses more than 3 times on the surface of a substrate. Because about 10-30 picoliter of a droplet is ejected by a present industrial ink-jet head and the diameter of the droplet is 27-39 um, if the droplet diffuses more than 3 times, it is difficult to form fine wiring of below 100 um. Therefore, in order to form fine wiring, prevention of spreading of ink-jet droplets via surface treatment of the substrate is required. However, since spreading and surface adhesiveness between droplets and substrate have negative correlation, surface treatment for preventing spreading generally decreases surface adhesiveness between droplets and substrate simultaneously.

Furthermore, for application of substrate wiring, more than 10 um width of wiring is needed. However via the present ink-jet technique wiring only below 1 um wiring is formed, and thus repeated printings are required. However repeated printings cause spreading of wiring. Further, it is known that another method to increase the width of wiring, high resolution printing, can cause bulging which means aggregation of bursting of some parts of printed wiring, if the droplets are stacked more than a certain degree on the surface that has been treated to prevent spreading.

Therefore, in producing a printed circuit board of fine wiring via ink-jet technique, a new method that can prevent spreading of droplets, is available for high resolution printing and repeated printings to increase the width of wiring, and can assure the adhesiveness between wiring and substrate is required.

SUMMARY

The present invention provides a method for forming fine wiring, which includes: preparing a substrate for a printed circuit board; forming a metal thin sacrificial layer on the substrate using a first metal nanoink; forming a wiring on the metal thin sacrificial layer by ink-jet printing using a second metal nanoink; and removing a portion of the metal thin sacrificial layer to form a wiring pattern.

According to one embodiment of the present invention, forming the metal thin sacrificial layer may include coating a first metal nanoink on the surface of the substrate; and drying to a degree sufficient to prevent flowing of the coated first metal nanoink by heat-treating of the first metal nanoink.

The first metal nanoink may be coated by one method selected from the group consisting of spin coating, screen coating and ink-jet coating.

The drying may be performed by drying the first metal nanoink such that the residual solvent becomes 10 to 90% in quantity.

According to one embodiment of the present invention, the first metal nanoink and the second metal nanoink may be both aqueous inks or both non-aqueous inks.

According to another embodiment of the present invention, the first metal nanoink may be an aqueous ink and the second metal ink may be a non-aqueous ink.

Here, a solvent contained in the aqueous ink may be at least one selected from the group consisting of water, alcohol, ether, and glycol, and a solvent contained the non-aqueous ink may be at least one selected from the group consisting of tetradecane, dodecane, toluene, and xylene.

When the aqueous ink is used as the first metal nanoink and the non-aqueous ink is used as the second metal nanoink, the method for forming fine wiring may further include curing the metal thin sacrificial layer after the forming of the metal thin sacrificial layer. Here, the curing is performed at 200 to 300° C.

According to one embodiment of the present invention, the method for forming fine wiring may further include performing surface treatment of the substrate before the forming of the metal thin sacrificial layer in order to improve adhesion of the metal thin sacrificial layer to the substrate.

According to one embodiment of the present invention, removing a portion of the metal thin sacrificial layer may be performed by one method selected from the group consisting of chemical etching, mechanical etching, polishing, and grinding.

BRIEF DESCRIPTION OF THE DRAWINGS

The patent or application file contains a least one drawing executed in color. Copies of this patent or patent application publication with color drawing(s) will be provided by the Office upon request and payment of the necessary fee.

FIG. 1A to 1D show a cross-sectional process diagram schematically illustrating a method for manufacturing a printed circuit board according to an embodiment of the invention.

DESCRIPTIONS FOR MAIN PARTS OF DRAWINGS

Figure 1A:
Figure 1B:
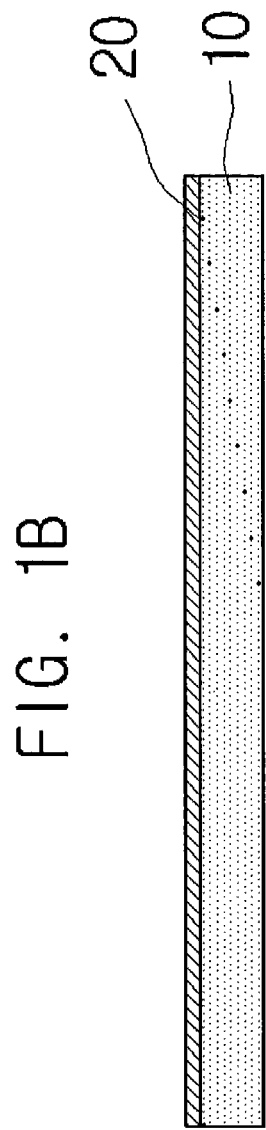
Figure 1D:
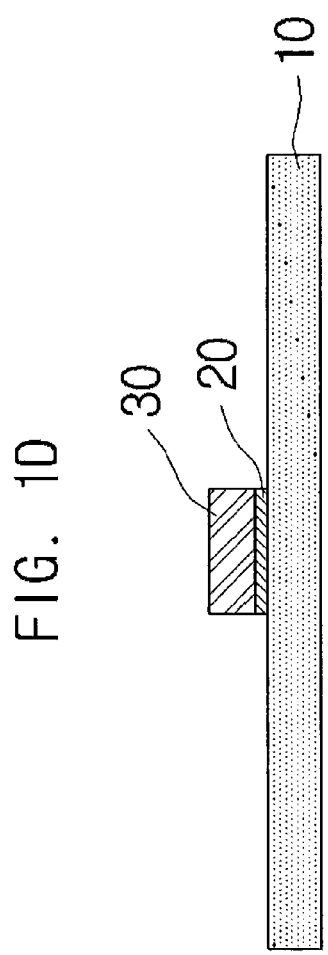

10: substrate
20: metal thin sacrificial layer
30: wiring

DETAILED DESCRIPTION

Hereinafter, the method for forming fine wiring according to the invention will be described more specifically.

In the process of pattern formation via ink-jet, spreading of droplets on a substrate may be varied with the dynamical relation between the surface energy of substrate and the surface tension of ink. For example, if the surface tension of ink is greater than the surface energy of substrate, spreading of ink will be low, contrarily, if the surface tension of ink is smaller than the surface energy of substrate, spreading of ink will be high. Though spreading can be controlled by adjusting the surface tension of ink or the surface energy of substrate, it is known that the adjustment of the surface energy of substrate is more effective. Prevention of spreading of droplets on a substrate can be achieved by surface treatment with compounds that can lower the surface energy such as fluorine, siloxane, silane, and fluorosilane, etc.

However, in surface treatment for preventing spreading of ink, it is very difficult to find an appropriate degree between spreading of ink and aggregation of ink that causes bulging, and since the compounds used to prevent spreading such as fluorine or silane have low surface energy and hardly bind with other compounds, most of them greatly decreases adhesiveness between ink and substrate.

Here, using the phenomenon of spreading of ink tactically, the invention is to not only prevent spreading of ink but also improve adhesiveness by forming a metal thin sacrificial layer on the substrate with metal nanoink which is used in forming a wiring pattern.

FIG. 1A to 1D show a cross-sectional process diagram schematically illustrating a method for manufacturing a printed circuit board according to an embodiment of the invention.

Referring to FIG. 1A to 1D, the method for forming fine wiring according to the present invention includes preparing a substrate for a printed circuit board (10); forming a metal thin sacrificial layer (20) on the substrate using a first metal nanoink; forming a wiring (30) on the metal thin sacrificial layer by ink-jet printing using a second metal nanoink; and removing a portion of the metal thin sacrificial layer to form a wiring pattern.

The method for producing fine wiring according to the invention is first preparing a substrate (10) for a printed circuit board.

The substrate (10) may be any insulating board that can be normally used as a printed circuit board and can tolerate curing. Specifically, the substrate may be a board using phenol resin or epoxy resin, or a polyimide board suitable for a flexible circuit board.

If the substrate (10) is prepared, a metal thin sacrificial layer (20) is formed on the substrate (10) using the first metal nanoink.

Since a substrate on which surface treatment is not performed have high surface energy, the droplets ejected by ink-jet veil the surface of the substrate to reduce the surface energy and the ink becomes to spread on the substrate. In repeated printings, though the ink spreads as set forth above in the first printing, from the second printing, droplets are printed on the previously printed ink, where the surface energy and the surface tension are similar that spreading of droplets does not occur greatly. In this manner, if a wiring (30) is formed after the metal thin sacrificial layer is formed on the substrate using metal nanoink, spreading of ink cab be significantly improved.

The first metal nanoink used in forming the metal thin sacrificial layer is an aqueous ink or a non-aqueous ink.

The metal nanoink is the ink for ink-jet printing including metal nanoparticles, which can be classified according to the solvent that disperses metal nanoparticles into aqueous ink and non-aqueous ink based on a main solvent.

Here, 'aqueous ink' means metal nanoink that normally uses alcohol system such as ethanol, ether system and glycol system such as ethylene glycol. General aqueous ink includes about 20 weight % of metal nanoparticles having 30-50 nm particle size. Metal nanoparticles may be a compound selected from the group consisting of palladium, silver, copper, nickel, tartar, palladium, rhodium, ruthenium, iridium, zinc, lead, indium, titan and mixtures thereof. Example of the aqueous ink may include about 10 weight % of ethanol, about 60 weight % of ethylene glycol, and about 10 weight % of additives having an appropriated viscosity range for dispersion stability or surface tension and ink-jet ejection.

'Non-aqueous ink' means metal nanoink that normally uses tetradecane, dodecane, toluene and xylene as a main solvent. Differently to the aqueous ink, the non-aqueous ink can normally include high concentration of about 60 weight % of metal nanoparticles of 3-10 nm particle size (kinds of metal nanoparticles are same as previously described), and the main solvent can include about 25 weight % of a non-aqueous solvent such as tetradecane, and about 15 weight % of additives set forth above.

The step of forming a metal thin sacrificial layer (20) on the substrate using a first metal ink can be processed with coating the first metal nanoink on the surface of the substrate (10); and heat-treating and drying the first metal nanoink to the degree of just preventing flowing of the coated nanoink.

Here, the first metal nanoink can be coated on the substrate via spin coating, screen coating, ink-jet coating, etc. In the case of using spin coating or screen coating, a metal thin sacrificial layer (20) can be formed over all portion of the substrate, but in the case of using ink-jet coating, a metal thin sacrificial layer (20) can be selectively formed on the position where a wiring pattern will be formed. Here, in the case of using ink-jet coating, it is preferable that the metal thin sacrificial layer is formed more widely than the wiring pattern that will be formed.

The first metal nanoink coated like this can control spreading of printed droplets with the degree of heat treatment. In the case that the coated metal nanoink is not dried, the droplets ejected next aggregate with the metal thin sacrificial layer and thus cannot form a fine wiring, and in the case that the coated metal nanoink is cured thoroughly, spreading rate may be increased because of difference of the surface tension between metal thin sacrificial layer and the droplets ejected next. Therefore, it is preferable that the metal nanoink be dried to the degree of just preventing flowing of the nanoink. 'Just preventing flowing of the nanoink' means drying a part of solvent of the metal nanoink so that the amount of the residual solvent preferably becomes 10-90%. More preferably, limiting the amount of the residual solvent below 50% can provide an optimal effect of preventing flowing.

For examples, metal nanoink can be semi-dried by heat treatment at 60-80° C. for 1 minute to 1 hour, temperature and duration are not limited if the same results can be obtained at higher temperature and for shorter time. If the heat treatment is performed in this condition, the surface energy of solvent of ink remaining in the metal thin sacrificial layer (20) and that of droplets of the ejected ink become similar and superior spreading preventing effect can be obtained.

According to an embodiment, the method for forming fine wiring according to the invention may further include surface treatment to improve adhesiveness between the metal thin sacrificial layer and the substrate before forming the metal thin sacrificial layer on the substrate. Although normal surface treatments to improve adhesiveness increase spreading rate of wiring, in the present invention, since surface treatment to improve adhesiveness only affects the spreading of the metal thin sacrificial layer that will be removed later, and does not affect the spreading of metal wiring that is printed on the metal thin sacrificial layer, so that formation of fine wiring and high adhesiveness can be obtained.

After forming the metal thin sacrificial layer (20), then wiring is formed on the metal thin sacrificial layer (20) using the second metal nanoink via ink-jet method.

After ejecting the second metal nanoink to form wiring (30) on the metal thin sacrificial layer (20), heat-treatment at 200-300° C. is performed to cure the wiring (30) thoroughly. In the case that curing is performed below 200° C., low specific resistance cannot be achieved, but in the case that curing is performed over 300° C., since it surpasses Tg of polymers, problems such as substrate deformation can occur.

According to an embodiment, the second metal nanoink used in forming the wiring (30) can be the same ink with the first metal nanoink that was used in forming the metal thin sacrificial layer. Therefore, the surface energy of the metal thin sacrificial layer formerly formed and surface tension of metal nanoink of the wiring (30) become similar so that spreading of droplets may not occur.

According to another embodiment of the invention, considering different printing properties of aqueous ink and non-aqueous ink, aqueous ink can be used as the first metal nanoink which is used for forming the metal thin sacrificial layer (20) and non-aqueous film can be used as the second ink which is used for forming the wiring (30).

In the case that the metal thin sacrificial layer (20) is formed using an aqueous ink, formation of wiring is possible without any special surface treatment, and then if wiring is formed on the metal thin sacrificial layer using a non-aqueous ink, line shape becomes neat and the content of metal nanoparticles is higher than using an aqueous ink, and further wiring having improved width can be obtained.

In the case of forming the metal thin sacrificial layer (20) using an aqueous ink, through curing the ink that was ejected on the substrate by heat-treating at 200-300° C., forming a wiring on the metal thin sacrificial layer by ink-jet printing using a second metal ink can be performed. The reason that limits the range of temperature has been previously described. In this case, if the metal thin sacrificial layer (20) is cured thoroughly, wiring that has neat line shape and improved width can be obtained using a non-aqueous ink ejected next.

After wiring (30) is formed on the metal thin sacrificial layer (20), a wiring pattern is formed by removing a part of the metal thin sacrificial layer (20).

Removing the metal thin sacrificial layer may be performed by one or more methods selected from the group consisting of chemical etching, mechanical etching, polishing, and grinding. Among these, chemical etching is the most desirable since the width of wiring can be minimized.

Hereinafter, although more detailed descriptions will be given by examples, those are only for explanation and there is no intention to limit the invention.

EXAMPLE 1

2 um width of a metal thin sacrificial layer was formed on the surface of a polyimide substrate by spin coating of silver nanoink which includes about 20 nm of silver nanoparticles and tetradecane and then the metal thin sacrificial layer was dried at 65° C. for 30 minutes. 18 Picoliters of droplets of the silver nanoink were repeatedly printed 3 times with 7000 DPI on the dried metal thin sacrificial layer to print a wiring with 70 um width and 14 um height. After curing of the printed wiring and the metal thin sacrificial layer by heating at 250° C. for 30 minutes, the metal thin sacrificial layer was removed by etching with nitric acid-based silver etching solution. The wiring obtained was fine and uniform having reduced tolerance after etching.

Figure 2A:
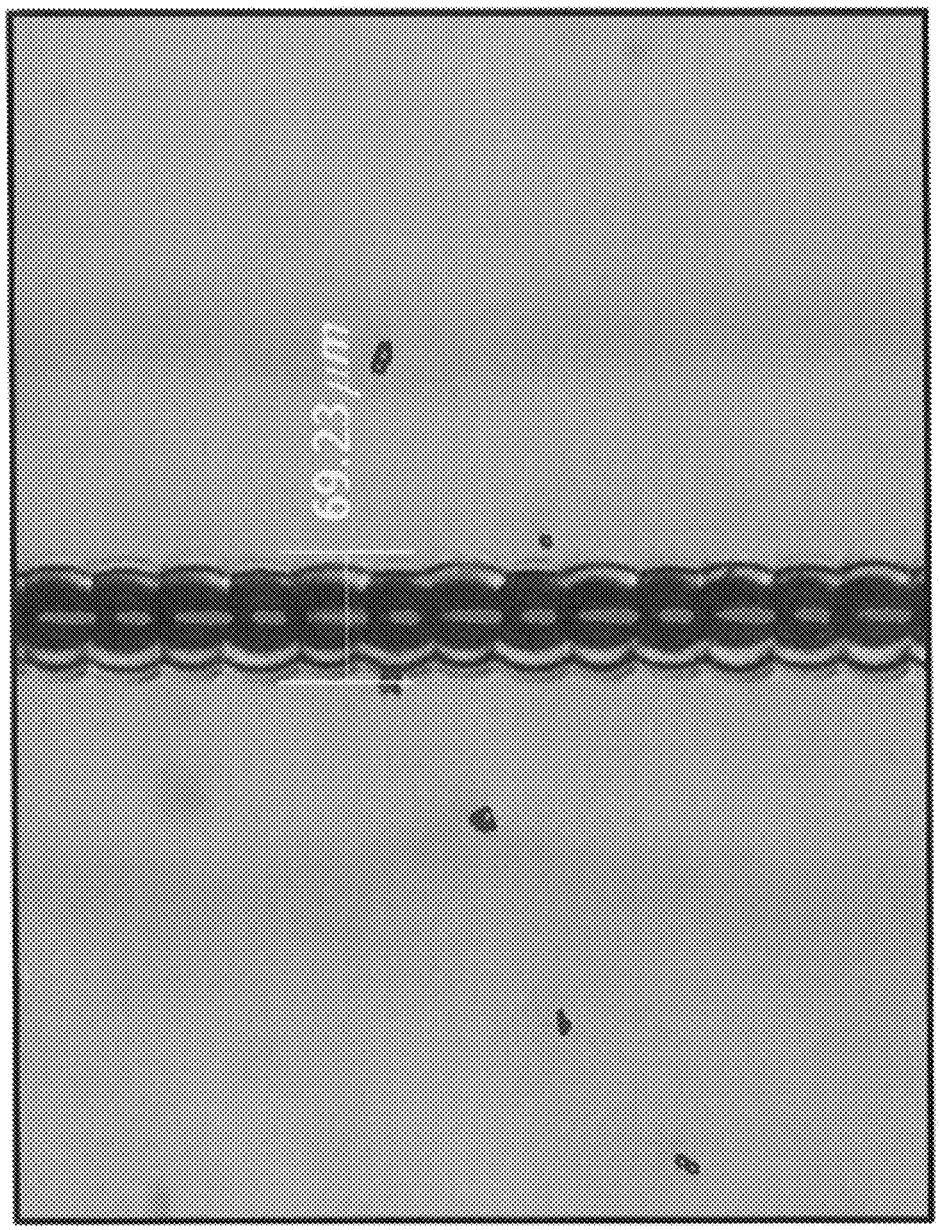
FIG. 2A is a photo illustrating the feature after forming wiring with metal nanoink in example 1 of the invention.
Figure 2B:
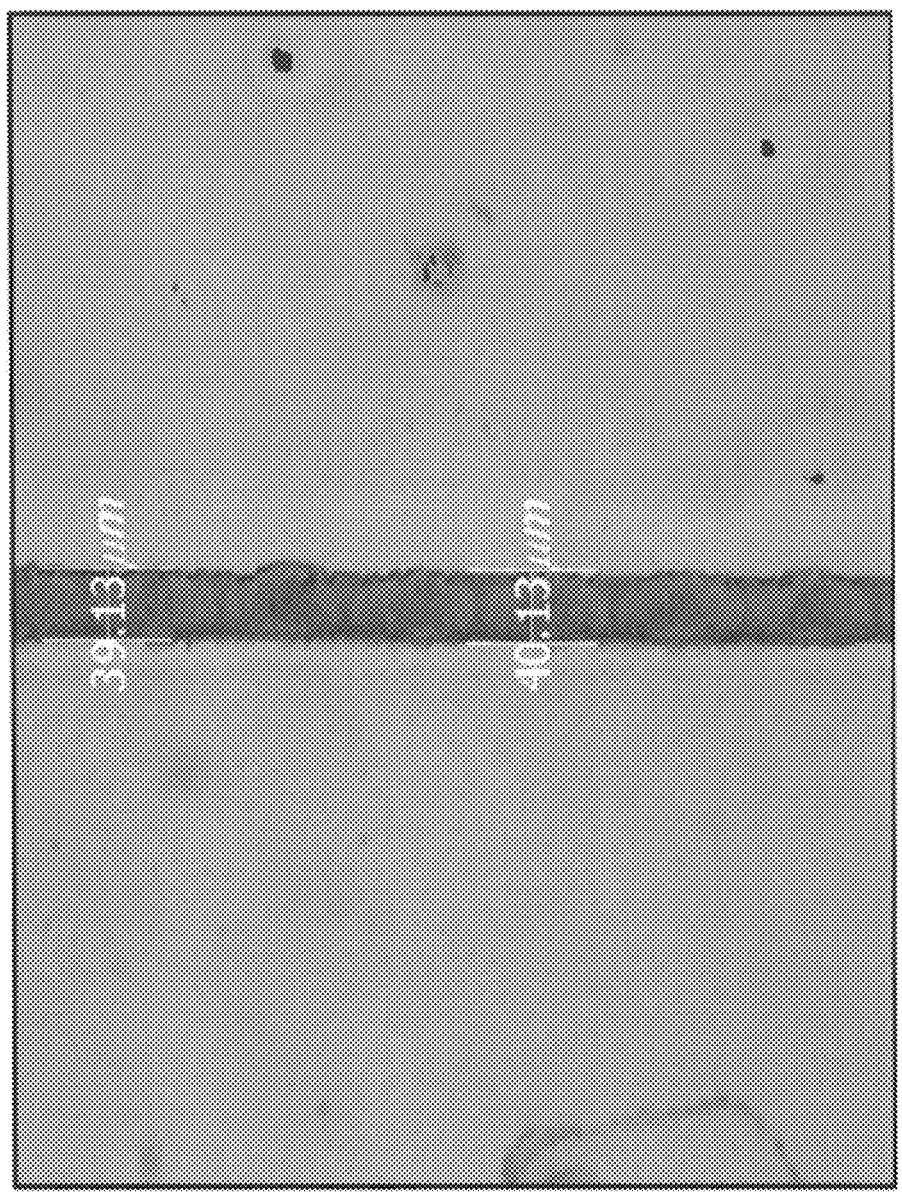
FIG. 2B is a photo illustrating wiring pattern after chemical etching in example 1 of the invention.

FIG. 2A is a photo of the wiring of example 1, that have been cured after being printed with silver nanoink on the metal thin sacrificial layer, and FIG. 2B is a photo illustrating the wiring after etching in example 1.

EXAMPLE 2

Figure 3:
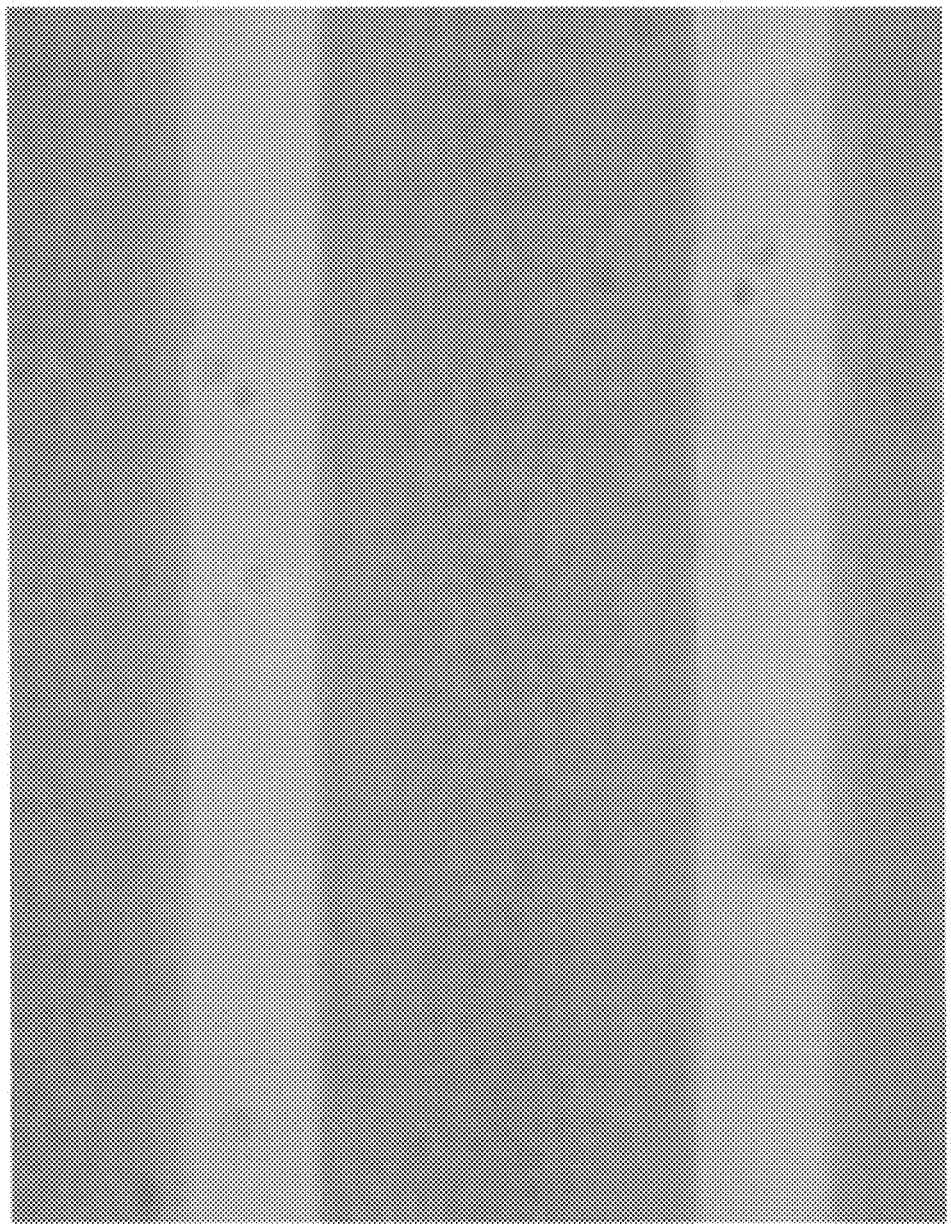
FIG. 3 is a photo illustrating wiring pattern obtained from example 2.

0.5 um Thickness of an aqueous ink layer was formed on the surface of a polyimide substrate by spin coating of the silver nanoink which includes about 20 nm of silver nanoparticles, ethanol and ethylene glycol. Then the layer was cured by heat treatment at 250° C. for 20 minutes and silver nano-ink including 20 nm of silver nanoparticles and tetradecane was printed thereon via ink-jet technique. This was cured by heating at 250° C. for 30 minutes and a line having 381.4 um width and 1.98 um deviation was obtained. The line tolerance was 1.04%. FIG. 3 is a photo illustrating the wiring pattern obtained from example 2.

The line tolerance was given by the following equation.

Line tolerance=([max width]−[min width])/(average width)

Max width: the maximum width at observed screen
Min width: the minimum width at observed screen
Average width: the average of observed width

EXAMPLE 3

0.4 um Width of an aqueous ink layer was formed on the surface of a polyimide substrate by spin coating of silver nanoink which includes about 10 nm of silver nanoparticles, ethanol and ethylene glycol. Then the layer was cured at 250° C. for 20 minutes and silver nano-ink including 10 nm of silver nanoparticles and tetradecane was printed thereon via ink-jet technique. This was cured by heating at 250° C. for 30 minutes and a line having 383.9 um width and 2.49 um deviation was obtained. The line tolerance was 1.04%.

EXPERIMENTAL EXAMPLE 1

Test for the Effect of Surface Treatment of Metal Sacrificial Layer

Figure 4:
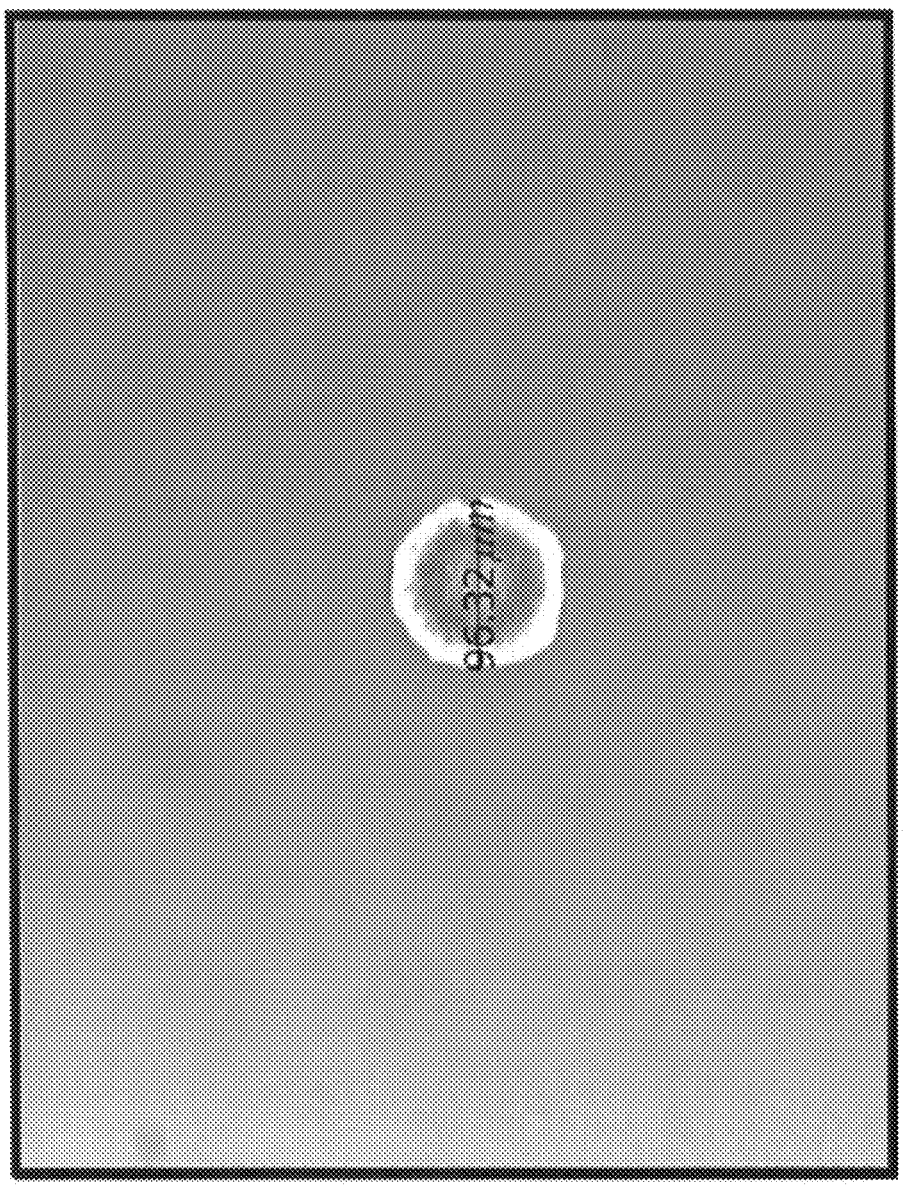
FIG. 4 is a photo illustrating spreading of a droplet in the case that surface treatment was not performed in experimental example 1.

18 Picoliters droplet of the silver nanoink used in example 1 (droplet size 32 um) was ejected. FIG. 4 is a photo illustrating spreading of an ejected droplet in the case that the surface treatment of a polyimide substrate was not performed, FIG. 5 is a photo showing spreading of an ejected droplet in the case that a metal sacrificial layer was formed, and FIG. 6 is a photo showing spreading of an ejected droplet in the case that the surface was treated with a fluoroalkyl compound (3M-novec).

Figure 5:
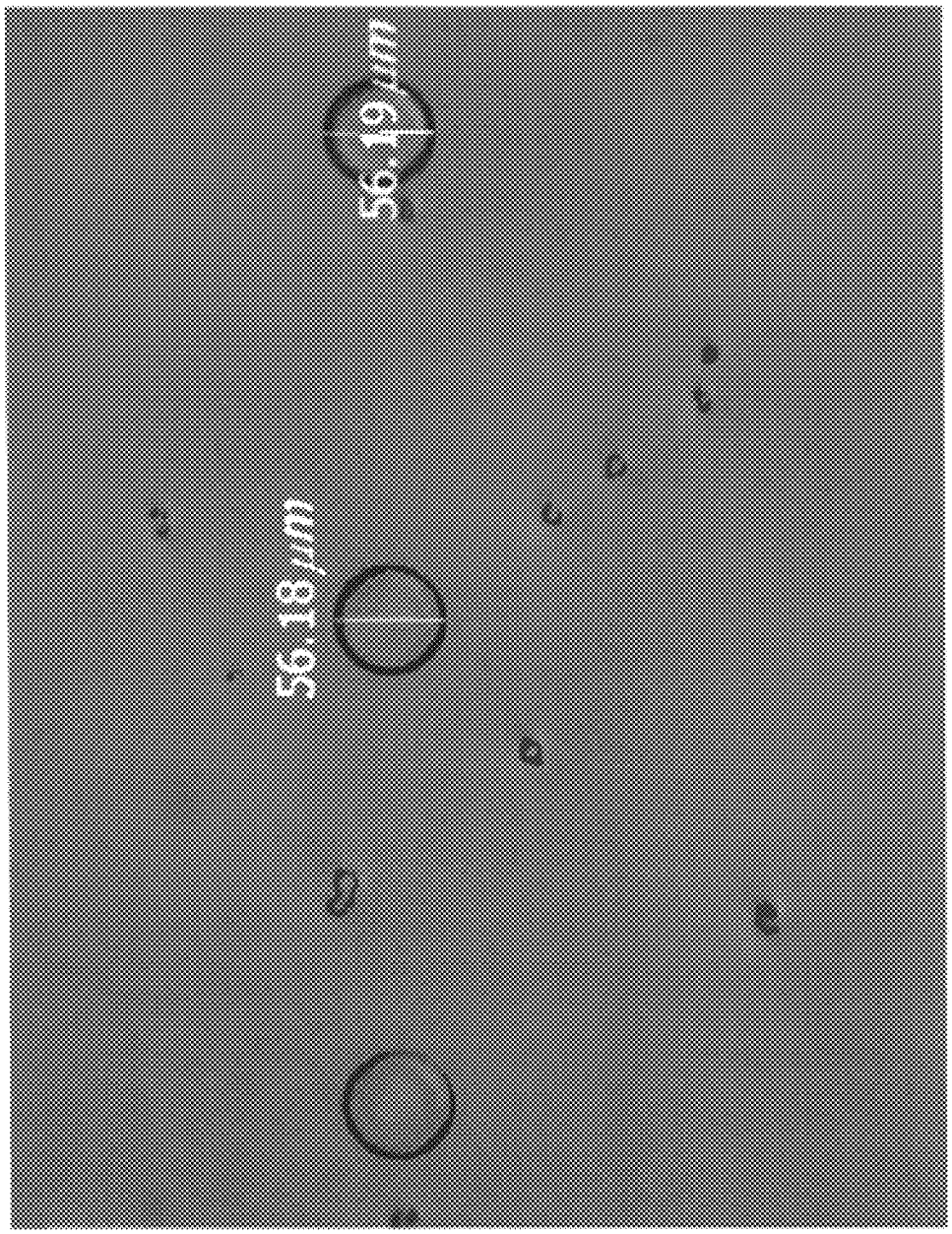
FIG. 5 is a photo illustrating spreading of a droplet on the metal thin sacrificial layer in experimental example 1.
Figure 6:
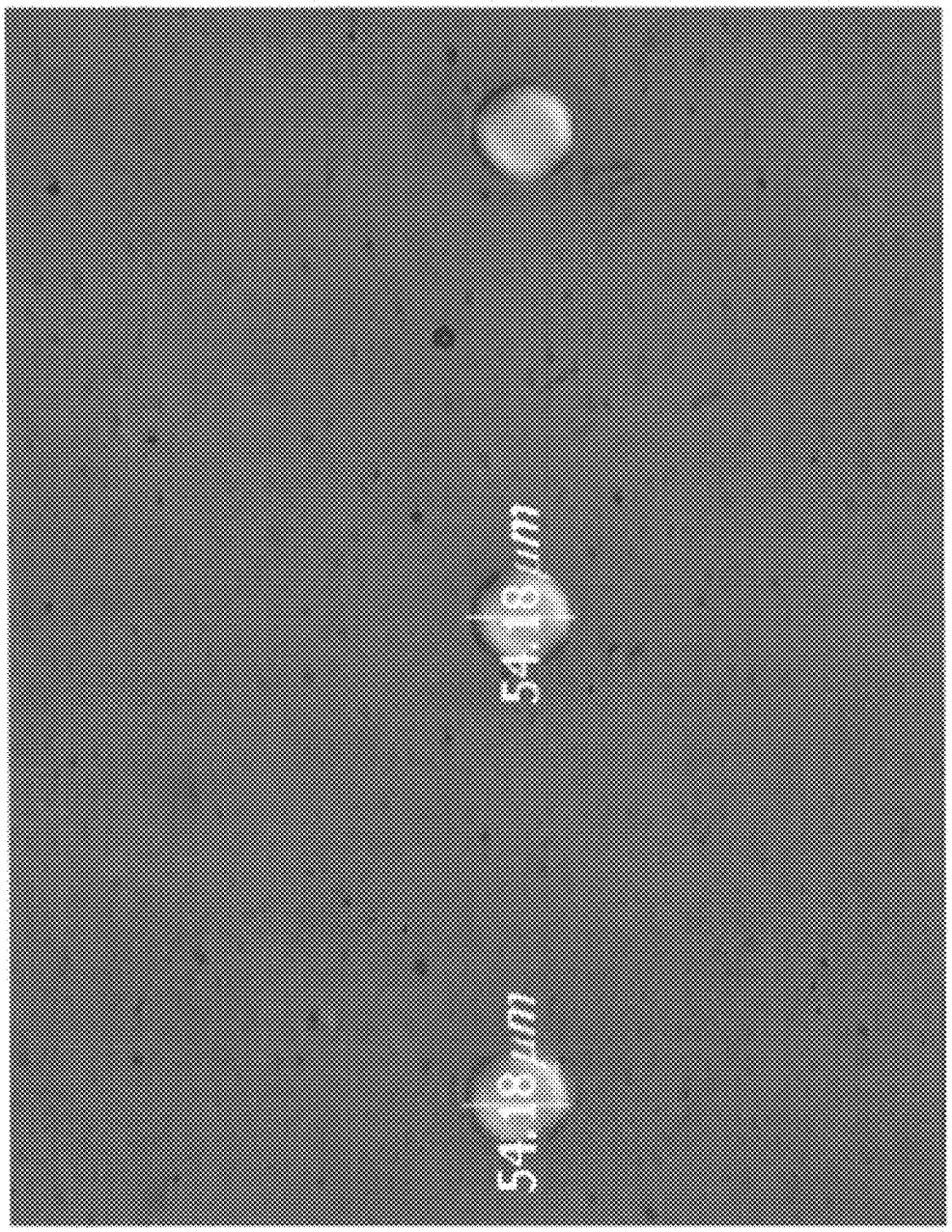
FIG. 6 is a photo illustrating spreading of a droplet in the case that fluorine treatment was performed in experimental example 1.

Referring to FIG. 4 to FIG. 6, it is noted that spreading of the ink on the metal sacrificial layer without additional surface treatment has been prevented since it showed almost same as that on the fluorine-treated substrate which is known as one of the most effective surface treatments.

EXPERIMENTAL EXAMPLE 2

Test for Controlling Spreading of a Droplet with a Degree of Heat Treatment of Metal Sacrificial Layer Silver sacrificial layer was formed on a polyimide substrate with the same method of example 1 using silver nanoink and spin coating, and the produced sacrificial layer was heat-treated at 65° C. for 30 minutes, and then 18 picoliters of a droplet of the silver nanoink was ejected with 7000 DPI to form a wiring. The formed wiring is illuminated in FIG. 7.

Figure 8:
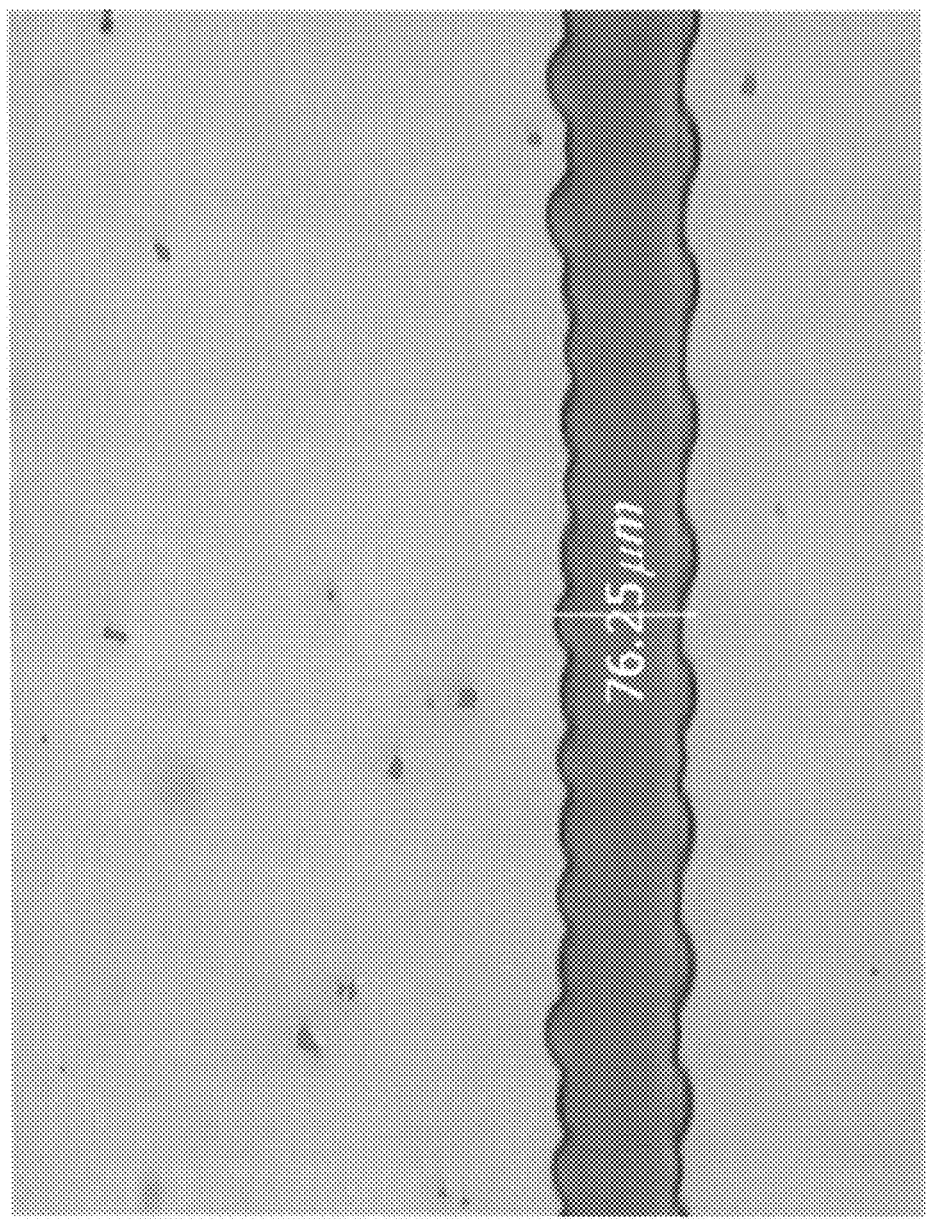
FIG. 8 is a photo illustrating wiring pattern in the case that metal thin sacrificial layer was heat treated at 250° C. for 30 minutes.

On the other hand, after the sacrificial layer was heat-treated at 250° C. for 30 minutes, the wiring was formed by the same method of ejecting silver nanoparticles and the result is illustrated in FIG. 8.

Figure 7:
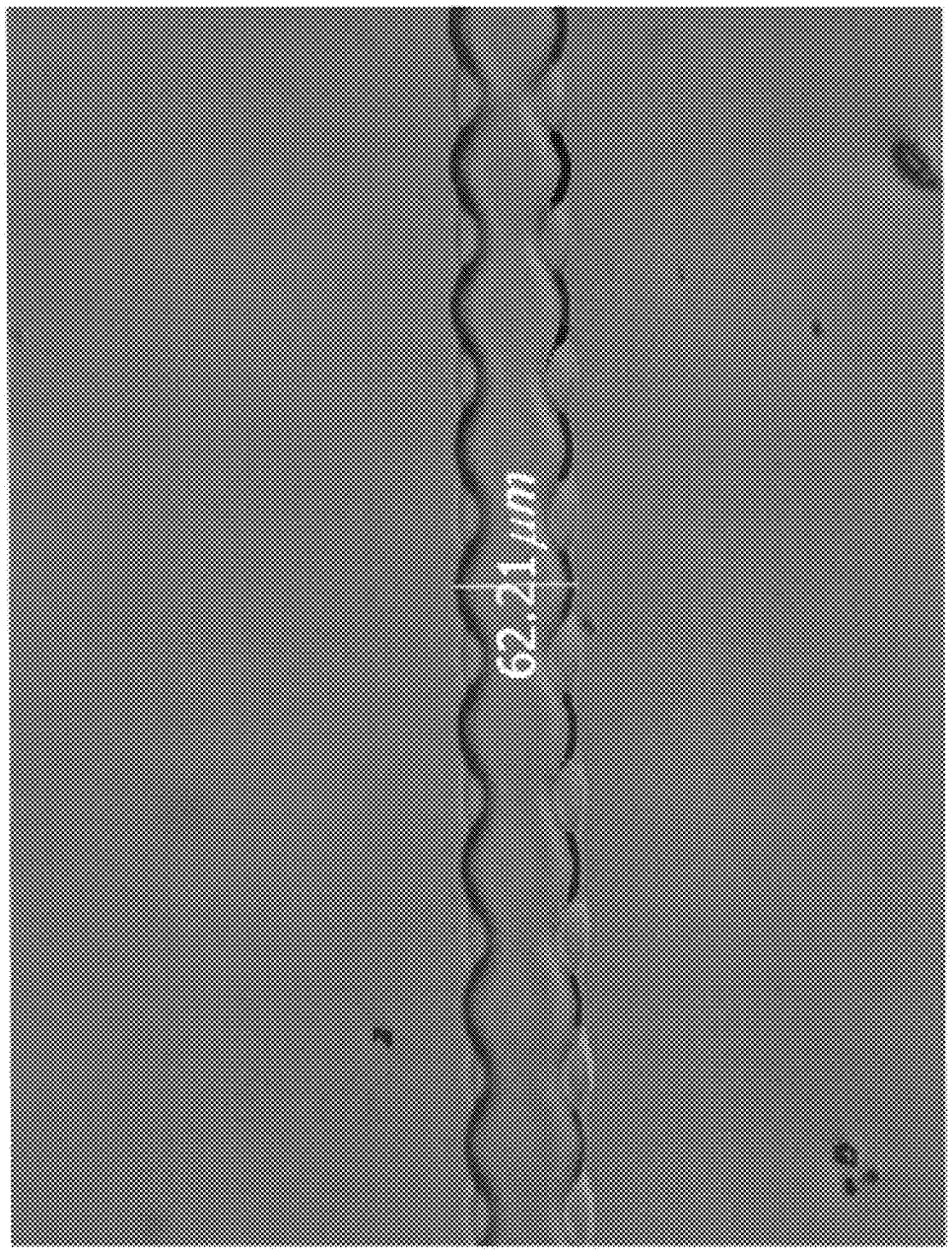
FIG. 7 is a photo of wiring pattern in the case that metal sacrifice film was heat-treated at 65° C. for 30 minutes.

As shown in FIG. 7 and FIG. 8, it can be known that if the nanoink is ejected via ink-jet under the condition that the metal sacrificial layer was not cured thoroughly, i.e, solvent was still remained in metal sacrificial layer, the surface energy of the ink solvent remaining in the metal sacrificial layer and the ejected ink droplet becomes similar, so that superior spreading preventing effect can be given.

As shown in the invention, via performing selective treatment on substrates, forming a metal sacrificial layer on a substrate using metal nanoink, forming fine wiring on the metal sacrificial layer, and then removing the metal sacrificial layer via etching, etc., increment of adhesiveness and fine wiring formation can be achieved simultaneously. Further, via control of heat treatment of the metal sacrificial layer, the surface energy of metal film and ink can be attenuated similarly, spreading can be prevented without additional surface treatment.

While the present invention has been described with reference to particular embodiments, it is to be appreciated that various changes and modifications may be made by those skilled in the art without departing from the spirit and scope of the present invention, as defined by the appended claims and their equivalents.

The present invention is not limited to those examples and it is also apparent that more changes may be made by those skilled in the art without departing from the principles and spirit of the present invention.

What is claimed is:

1. A method for forming fine wiring, the method comprising steps of:
   preparing a substrate for a printed circuit board;
   forming a metal thin sacrificial layer on the substrate using a first metal ink, wherein the first metal ink is an aqueous ink, and wherein the step of forming the metal thin sacrificial layer comprises:
      coating the first metal ink on the surface of the substrate; and
      drying to a degree sufficient to prevent flowing of the coated first metal ink by heat treating the first metal ink until the amount of the residual solvent of the metal ink becomes 10 to 90%;
   curing the metal thin sacrificial layer;
   after the curing step, forming a wiring on the metal thin sacrificial layer by ink-jet printing using a second metal ink, wherein the second metal ink is a non-aqueous ink; and
   removing a portion of the metal thin sacrificial layer to form a wiring pattern.

2. The method of claim 1, wherein the first metal ink is coated by one method selected from the group consisting of spin coating, screen coating and ink-jet coating.

3. The method of claim 1, wherein a solvent contained in the aqueous ink is at least one selected from the group consisting of water, alcohol, ether, and glycol.

4. The method of claim 1, wherein a solvent contained the non-aqueous ink is at least one selected from the group consisting of tetradecane, dodecane, toluene, and xylene.

5. The method of claim 1, further comprising the step of:
   performing surface treatment of the substrate before the forming of the metal thin sacrificial layer in order to improve adhesion of the metal thin sacrificial layer to the substrate.

6. The method of claim 1, wherein the removing is performed by one method selected from the group consisting of chemical etching, mechanical etching, polishing, and grinding.

\* \* \* \* \*